(12) United States Patent
Kim et al.

(10) Patent No.: US 8,525,318 B1
(45) Date of Patent: Sep. 3, 2013

(54) SEMICONDUCTOR DEVICE AND FABRICATING METHOD THEREOF

(75) Inventors: Jin Seong Kim, Seoul (KR); Dong Joo Park, Incheon (KR); Kwang Ho Kim, Kyunggi-do (KR); Ye Sul Ahn, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 378 days.

(21) Appl. No.: 12/943,540

(22) Filed: Nov. 10, 2010

(51) Int. Cl.
*H01L 23/02* (2006.01)

(52) U.S. Cl.
USPC .............................. 257/686; 257/778; 438/124

(58) Field of Classification Search
USPC ........................... 257/676, 686, 778; 438/124
See application file for complete search history.

(56) References Cited

U.S. PATENT DOCUMENTS

| | | |
|---|---|---|
| 3,868,724 A | 2/1975 | Perrino |
| 3,916,434 A | 10/1975 | Garboushian |
| 4,322,778 A | 3/1982 | Barbour et al. |
| 4,532,419 A | 7/1985 | Takeda |
| 4,642,160 A | 2/1987 | Burgess |
| 4,645,552 A | 2/1987 | Vitriol et al. |
| 4,685,033 A | 8/1987 | Inoue |
| 4,706,167 A | 11/1987 | Sullivan |
| 4,716,049 A | 12/1987 | Patraw |
| 4,786,952 A | 11/1988 | MacIver et al. |
| 4,806,188 A | 2/1989 | Rellick |
| 4,811,082 A | 3/1989 | Jacobs et al. |
| 4,897,338 A | 1/1990 | Spicciati et al. |
| 4,905,124 A | 2/1990 | Banjo et al. |
| 4,964,212 A | 10/1990 | Deroux-Dauphin et al. |
| 4,974,120 A | 11/1990 | Kodai et al. |
| 4,996,391 A | 2/1991 | Schmidt |
| 5,021,047 A | 6/1991 | Movern |
| 5,072,075 A | 12/1991 | Lee et al. |
| 5,072,520 A | 12/1991 | Nelson |
| 5,081,520 A | 1/1992 | Yoshii et al. |
| 5,091,769 A | 2/1992 | Eichelberger |

(Continued)

FOREIGN PATENT DOCUMENTS

| | | |
|---|---|---|
| JP | 05-109975 | 4/1993 |
| JP | 05-136323 | 6/1993 |

(Continued)

OTHER PUBLICATIONS

IBM Technical Disclosure Bulletin, "Microstructure Solder Mask by Means of a Laser", vol. 36, Issue 11, p. 589, Nov. 1, 1993. (NN9311589).

(Continued)

*Primary Examiner* — Jarrett Stark
*Assistant Examiner* — John M Parker
(74) *Attorney, Agent, or Firm* — McKay and Hodgson, LLP; Serge J. Hodgson (57) ABSTRACT

Disclosed are a semiconductor device capable of efficiently radiating heat of a semiconductor die and a method of fabricating the same. The semiconductor device efficiently radiates the heat by preventing an encapsulant from reaching the semiconductor die by an encapsulant dam so that an upper surface of the semiconductor die is exposed out of the encapsulant. In addition, the semiconductor device is configured to expose a pre-solder ball or a conductive pattern of a substrate through a via of the encapsulant. Therefore, electrical connection between the pre-solder ball and a solder ball of another semiconductor device stacked thereon is easily achieved.

19 Claims, 6 Drawing Sheets

(56) References Cited

U.S. PATENT DOCUMENTS

| | | | |
|---|---|---|---|
| 5,108,553 A | 4/1992 | Foster et al. |
| 5,110,664 A | 5/1992 | Nakanishi et al. |
| 5,191,174 A | 3/1993 | Chang et al. |
| 5,229,550 A | 7/1993 | Bindra et al. |
| 5,239,448 A | 8/1993 | Perkins et al. |
| 5,247,429 A | 9/1993 | Iwase et al. |
| 5,250,843 A | 10/1993 | Eichelberger |
| 5,278,726 A | 1/1994 | Bernardoni et al. |
| 5,283,459 A | 2/1994 | Hirano et al. |
| 5,353,498 A | 10/1994 | Fillion et al. |
| 5,371,654 A | 12/1994 | Beaman et al. |
| 5,379,191 A | 1/1995 | Carey et al. |
| 5,404,044 A | 4/1995 | Booth et al. |
| 5,463,253 A | 10/1995 | Waki et al. |
| 5,474,957 A | 12/1995 | Urushima |
| 5,474,958 A | 12/1995 | Djennas et al. |
| 5,497,033 A | 3/1996 | Fillion et al. |
| 5,508,938 A | 4/1996 | Wheeler |
| 5,530,288 A | 6/1996 | Stone |
| 5,531,020 A | 7/1996 | Durand et al. |
| 5,546,654 A | 8/1996 | Wojnarowski et al. |
| 5,574,309 A | 11/1996 | Papapietro et al. |
| 5,581,498 A | 12/1996 | Ludwig et al. |
| 5,582,858 A | 12/1996 | Adamopoulos et al. |
| 5,616,422 A | 4/1997 | Ballard et al. |
| 5,637,832 A | 6/1997 | Danner |
| 5,674,785 A | 10/1997 | Akram et al. |
| 5,719,749 A | 2/1998 | Stopperan |
| 5,726,493 A | 3/1998 | Yamashita et al. |
| 5,739,581 A | 4/1998 | Chillara |
| 5,739,585 A | 4/1998 | Akram et al. |
| 5,739,588 A | 4/1998 | Ishida et al. |
| 5,742,479 A | 4/1998 | Asakura |
| 5,774,340 A | 6/1998 | Chang et al. |
| 5,784,259 A | 7/1998 | Asakura |
| 5,798,014 A | 8/1998 | Weber |
| 5,822,190 A | 10/1998 | Iwasaki |
| 5,826,330 A | 10/1998 | Isoda et al. |
| 5,835,355 A | 11/1998 | Dordi |
| 5,847,453 A | 12/1998 | Uematsu et al. |
| 5,866,949 A * | 2/1999 | Schueller | 257/778 |
| 5,883,425 A | 3/1999 | Kobayashi |
| 5,894,108 A | 4/1999 | Mostafazadeh et al. |
| 5,903,052 A | 5/1999 | Chen et al. |
| 5,907,477 A | 5/1999 | Tuttle et al. |
| 5,924,003 A | 7/1999 | Slocum |
| 5,936,843 A | 8/1999 | Ohshima et al. |
| 5,952,611 A | 9/1999 | Eng et al. |
| 6,004,619 A | 12/1999 | Dippon et al. |
| 6,013,948 A | 1/2000 | Akram et al. |
| 6,021,564 A | 2/2000 | Hanson |
| 6,028,364 A | 2/2000 | Ogino et al. |
| 6,034,427 A | 3/2000 | Lan et al. |
| 6,035,527 A | 3/2000 | Tamm |
| 6,040,622 A | 3/2000 | Wallace |
| 6,060,778 A | 5/2000 | Jeong et al. |
| 6,069,407 A | 5/2000 | Hamzehdoost |
| 6,072,243 A | 6/2000 | Nakanishi |
| 6,081,036 A | 6/2000 | Hirano et al. |
| 6,119,338 A | 9/2000 | Wang et al. |
| 6,122,171 A | 9/2000 | Akram et al. |
| 6,127,833 A | 10/2000 | Wu et al. |
| 6,160,705 A | 12/2000 | Stearns et al. |
| 6,172,419 B1 | 1/2001 | Kinsman |
| 6,175,087 B1 | 1/2001 | Keesler et al. |
| 6,184,463 B1 | 2/2001 | Panchou et al. |
| 6,194,250 B1 | 2/2001 | Melton et al. |
| 6,204,453 B1 | 3/2001 | Fallon et al. |
| 6,214,641 B1 | 4/2001 | Akram |
| 6,235,554 B1 | 5/2001 | Akram et al. |
| 6,239,485 B1 | 5/2001 | Peters et al. |
| D445,096 S | 7/2001 | Wallace |
| D446,525 S | 8/2001 | Okamoto et al. |
| 6,274,821 B1 | 8/2001 | Echigo et al. |
| 6,280,641 B1 | 8/2001 | Gaku et al. |
| 6,316,285 B1 | 11/2001 | Jiang et al. |
| 6,351,031 B1 | 2/2002 | Iijima et al. |
| 6,353,999 B1 | 3/2002 | Cheng |
| 6,365,975 B1 | 4/2002 | DiStefano et al. |
| 6,376,906 B1 | 4/2002 | Asai et al. |
| 6,392,160 B1 | 5/2002 | Andry et al. |
| 6,395,578 B1 | 5/2002 | Shin et al. |
| 6,405,431 B1 | 6/2002 | Shin et al. |
| 6,406,942 B2 | 6/2002 | Honda |
| 6,407,341 B1 | 6/2002 | Anstrom et al. |
| 6,407,930 B1 | 6/2002 | Hsu |
| 6,448,510 B1 | 9/2002 | Neftin et al. |
| 6,451,509 B2 | 9/2002 | Keesler et al. |
| 6,479,762 B2 | 11/2002 | Kusaka |
| 6,497,943 B1 | 12/2002 | Jimarez et al. |
| 6,517,995 B1 | 2/2003 | Jacobson et al. |
| 6,534,391 B1 | 3/2003 | Huemoeller et al. |
| 6,544,638 B2 | 4/2003 | Fischer et al. |
| 6,586,682 B2 | 7/2003 | Strandberg |
| 6,608,757 B1 | 8/2003 | Bhatt et al. |
| 6,660,559 B1 | 12/2003 | Huemoeller et al. |
| 6,715,204 B1 | 4/2004 | Tsukada et al. |
| 6,727,645 B2 | 4/2004 | Tsujimura et al. |
| 6,730,857 B2 | 5/2004 | Konrad et al. |
| 6,734,542 B2 | 5/2004 | Nakatani et al. |
| 6,740,964 B2 | 5/2004 | Sasaki |
| 6,753,612 B2 | 6/2004 | Adae-Amoakoh et al. |
| 6,774,748 B1 | 8/2004 | Ito et al. |
| 6,787,443 B1 | 9/2004 | Boggs et al. |
| 6,803,528 B1 | 10/2004 | Koyanagi |
| 6,815,709 B2 | 11/2004 | Clothier et al. |
| 6,815,739 B2 | 11/2004 | Huff et al. |
| 6,838,776 B2 | 1/2005 | Leal et al. |
| 6,888,240 B2 | 5/2005 | Towle et al. |
| 6,919,514 B2 | 7/2005 | Konrad et al. |
| 6,921,968 B2 | 7/2005 | Chung |
| 6,921,975 B2 | 7/2005 | Leal et al. |
| 6,931,726 B2 | 8/2005 | Boyko et al. |
| 6,953,995 B2 | 10/2005 | Farnworth et al. |
| 6,987,314 B1 | 1/2006 | Yoshida et al. |
| 7,015,075 B2 | 3/2006 | Fay et al. |
| 7,030,469 B2 | 4/2006 | Mahadevan et al. |
| 7,081,661 B2 | 7/2006 | Takehara et al. |
| 7,125,744 B2 | 10/2006 | Takehara et al. |
| 7,185,426 B1 | 3/2007 | Hiner et al. |
| 7,198,980 B2 | 4/2007 | Jiang et al. |
| 7,242,081 B1 | 7/2007 | Lee |
| 7,245,008 B2 * | 7/2007 | Lee | 257/686 |
| 7,282,394 B2 | 10/2007 | Cho et al. |
| 7,285,855 B2 | 10/2007 | Foong |
| 7,345,361 B2 | 3/2008 | Mallik et al. |
| 7,372,151 B1 | 5/2008 | Fan et al. |
| 7,429,786 B2 | 9/2008 | Karnezos et al. |
| 7,459,202 B2 | 12/2008 | Magera et al. |
| 7,548,430 B1 | 6/2009 | Huemoeller et al. |
| 7,550,857 B1 | 6/2009 | Longo et al. |
| 7,633,765 B1 | 12/2009 | Scanlan et al. |
| 7,671,457 B1 | 3/2010 | Hiner et al. |
| 7,777,351 B1 | 8/2010 | Berry et al. |
| 7,825,520 B1 | 11/2010 | Longo et al. |
| 7,985,628 B2 * | 7/2011 | Kuan et al. | 438/124 |
| 2002/0017712 A1 | 2/2002 | Bessho et al. |
| 2002/0061642 A1 | 5/2002 | Haji et al. |
| 2002/0066952 A1 | 6/2002 | Taniguchi et al. |
| 2002/0195697 A1 | 12/2002 | Mess et al. |
| 2003/0025199 A1 | 2/2003 | Wu et al. |
| 2003/0128096 A1 | 7/2003 | Mazzochette |
| 2003/0141582 A1 | 7/2003 | Yang et al. |
| 2003/0197284 A1 | 10/2003 | Khiang et al. |
| 2004/0063246 A1 | 4/2004 | Karnezos |
| 2004/0145044 A1 | 7/2004 | Sugaya et al. |
| 2004/0159462 A1 | 8/2004 | Chung |
| 2005/0139985 A1 | 6/2005 | Takahashi |
| 2005/0242425 A1 | 11/2005 | Leal et al. |
| 2007/0273049 A1 | 11/2007 | Khan et al. |
| 2007/0281471 A1 | 12/2007 | Hurwitz et al. |
| 2007/0290376 A1 | 12/2007 | Zhao et al. |
| 2008/0230887 A1 | 9/2008 | Sun et al. |
| 2009/0166825 A1 * | 7/2009 | Camacho et al. | 257/676 |

FOREIGN PATENT DOCUMENTS

| | | |
|---|---|---|
| JP | 07-017175 | 1/1995 |
| JP | 08-190615 | 7/1996 |
| JP | 10-334205 | 12/1998 |

OTHER PUBLICATIONS

Kim et al., "Application of Through Mold Via (TMV) as PoP base package", *58th ECTC Proceedings*, May 2008, Lake Buena Vista, FL, 6 pages, IEEE.

Scanlan, "Package-on-package (PoP) with Through-mold Vias", *Advanced Packaging*, Jan. 2008, 3 pages, vol. 17, Issue 1, PennWell Corporation.

Hiner et al., "Printed Wiring Motherboard Having Bonded Interconnect Redistribution Mesa", U.S. Appl. No. 10/992,371, filed Nov. 18, 2004.

Huemoeller et al., "Build Up Motherboard Fabrication Method and Structure", U.S. Appl. No. 11/824,395, filed Jun. 29, 2007.

Huemoeller et al., "Buildup Dielectric Layer Having Metallization Pattern Semiconductor Package Fabrication Method", U.S. Appl. No. 12/387,691, filed May 5, 2009.

Miller, Jr. et al., "Thermal Via Heat Spreader Package and Method", U.S. Appl. No. 12/421,118, filed Apr. 9, 2009.

Darveaux et al., "Stackable Treated Via Package and Method", U.S. Appl. No. 12/787,238, filed May 25, 2010.

Darveaux et al., "Stackable Package and Method", U.S. Appl. No. 12/917,185, filed Nov. 1, 2010.

\* cited by examiner

SEMICONDUCTOR DEVICE AND FABRICATING METHOD THEREOF

TECHNICAL FIELD

The present application relates to a semiconductor device and a fabricating method thereof.

BACKGROUND

According to the development of the electronic device technology, various functions and a high response speed of a semiconductor device are required. In addition, considering that heat is generated from a semiconductor die during the operation of the semiconductor device, efficient radiation of the heat is important to increase the signal transmission rate and the lifespan of the semiconductor device.

BRIEF DESCRIPTION OF THE DRAWINGS

Common reference numerals are used throughout the drawings and the detailed description to indicate the same or similar elements.

DETAILED DESCRIPTION

Figure 1:
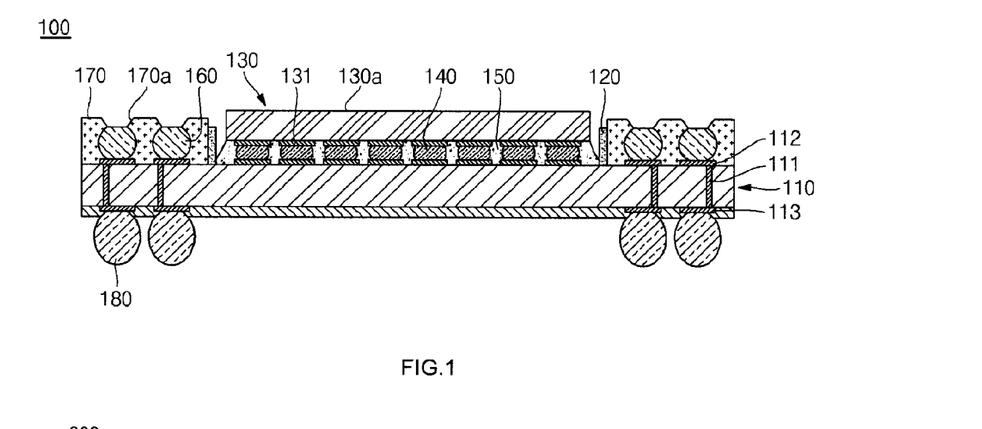
FIG. 1 is a sectional view of a semiconductor device according to one embodiment.

As an overview and in accordance with one embodiment, referring to FIG. 1, a semiconductor device 100 includes a substrate 110. An encapsulant dam 120 is formed on the substrate 110, the encapsulant dam 120 defining an inner region inward of the encapsulant dam 120 and an outer region outward of the encapsulant dam 120. A semiconductor die 130 is disposed in the inner region partitioned off by the encapsulant dam 120. The encapsulant dam 120 isolates an encapsulant 170 from the inner region where the semiconductor die 130 is mounted. Therefore, an upper surface 130a of the semiconductor die 130 is exposed directly to the ambient environment and from the encapsulant 170. As a result, heat generated by the semiconductor die 130 may be efficiently radiated through the upper surface 130a.

Now in more detail, FIG. 1 shows a sectional view of a semiconductor device 100 according to one embodiment. As shown in FIG. 1, the semiconductor device 100 includes a substrate 110, an encapsulant dam 120 disposed on an upper part of the substrate 110 to define an inner region, a semiconductor die 130 disposed in the inner region of the encapsulant dam 120, conductive bumps 140 bringing the substrate 110 into electrical connection with the semiconductor die 130, underfill 150 disposed between respective neighboring conductive bumps 140, pre-solder balls 160 disposed around an outer periphery of the encapsulant dam 120, and an encapsulant 170 disposed around an outer periphery of the encapsulant dam 120 to enclose the pre-solder balls 160. The semiconductor device 100 according to the embodiment may further include solder balls 180 disposed at a lower part of the substrate 110.

The substrate 110 has a substantial plate shape. The substrate 110 includes a plurality of conductive vias 111 formed through the substrate 110, a plurality of conductive patterns 112 disposed on an upper surface of the substrate 110 and electrically connected with the conductive vias 111, and a plurality of lands 113 disposed on a lower surface of the substrate 110 and electrically connected with the conductive vias 111. The lands 113 may be covered with a solder mask except for regions to be exposed to the lower part of the substrate 110.

The encapsulant dam 120 protrudes from the upper part of the substrate 110, thereby partitioning off a closed inner region. The encapsulant dam 120 may be fabricated using general solder resist. In addition, the semiconductor die 130 is formed in the inner region closed by the encapsulant dam 120. The inner region defined by the encapsulant dam 120 has a larger area than the semiconductor die 130 allowing the semiconductor die 130 to be located within the inner region. The encapsulant dam 120 prevents the encapsulant 170 from reaching the semiconductor die 130 during fabrication of the encapsulant 170. To this end, the encapsulant 170 is arranged around the periphery of the encapsulant dam 120. Accordingly, due to the encapsulant dam 120, the semiconductor die 130 is not covered with the encapsulant 170 but exposed to the outside of the semiconductor device 100.

The semiconductor die 130 is disposed at the upper part of the substrate 110. The semiconductor die 130 is disposed in the inner region partitioned off by the encapsulant dam 120 and includes a plurality of bond pads 131 on one surface thereof. The semiconductor die 130 has a flip chip structure such that the bond pads 131 are directed to the substrate 110. In addition, the encapsulant dam 120 isolates the encapsulant 170 from a region of the substrate 110 where the semiconductor die 130 is formed. Therefore, an upper surface 130a of the semiconductor die 130 is exposed directly to the ambient environment and from the encapsulant 170. As a result, heat generated by the semiconductor die 130 may be efficiently radiated through the upper surface 130a.

The semiconductor die 130 is connected with the conductive patterns 112 of the substrate 110 through the conductive bumps 140. More specifically, the semiconductor die 130 is electrically connected with some conductive patterns 112, sometimes called flip chip terminals, disposed within the inner region of the encapsulant dam 120 out of all the conductive patterns 112.

The conductive bumps 140 connect the conductive patterns 112 on the substrate 110 with the semiconductor die 130. The conductive bumps 140, being attached to the bond pads 131 of the semiconductor die 130, are connected to the upper surface of the substrate 110. The conductive bumps 140 are connected with the bond pads 131, respectively, to supply a path for input and output of electrical signals.

The underfill 150 is disposed around the conductive bumps 140, in the inner region defined by the encapsulant dam 120. The underfill 150 fills gaps between the respective conductive bumps 140. In addition, the underfill 150 has a smaller height than the encapsulant dam 120. The underfill 150 maintains a stable cohesion among the substrate 110, the semiconductor die 130, and the conductive bumps 140 by filling gaps among them.

The pre-solder balls 160 are disposed around the outer periphery of the encapsulant dam 120 on the upper part of the substrate 110. The pre-solder balls 160 are electrically connected with some conductive patterns 112, sometimes called stacking terminals, disposed around the outer periphery of the encapsulant dam 120 out of all the conductive patterns 112 formed on the substrate 110. The pre-solder balls 160 protrude from the substrate 110 and are enclosed by the encapsulant 170. However, upper parts of the pre-solder balls 160 are exposed through via apertures 170a. The upper parts of the pre-solder balls 160 may be planarized during a laser drilling process performed for forming the via apertures 170a of the encapsulant 170. Accordingly, when another semiconductor device is further stacked, the pre-solder balls 160 may form an electrical connection path along with solder balls of the stacked semiconductor device.

The encapsulant 170 is disposed on the upper part of the substrate 110, more specifically, around the outer periphery of the encapsulant dam 120 by being fabricated to be isolated from the semiconductor die 130 by the encapsulant dam 120. Accordingly, the encapsulant 170 is disposed around the outer periphery of the semiconductor die 130. The encapsulant 170 fixes the pre-solder balls 160 in an enclosing manner and prevents a short circuit between the pre-solder balls 160.

The solder balls 180 are disposed at the lower part of the substrate 110. The solder balls 180 are electrically connected with the lands 113 of the substrate 110. The solder balls 180 electrically connect the substrate 110 with an external circuit or with the semiconductor device disposed thereunder. Electrical signals applied through the solder balls 180 are transmitted to the semiconductor die 130 through the lands 113, the conductive vias 111, the conductive patterns 112, and the conductive bumps 140.

As described above, in the semiconductor device 100 according to this embodiment, the encapsulant 170 is isolated from the semiconductor die 130 by the existence of the encapsulant dam 120. Accordingly, the upper surface 130a of the semiconductor die 130 may be exposed out of the encapsulant 170 and heat from the semiconductor die 130 may be efficiently radiated. In addition, since the upper parts of the pre-solder balls 160 are exposed through the via apertures 170a of the encapsulant 170, solder balls of another semiconductor device stacked thereon may be easily connected with the pre-solder balls 160.

Figure 2:
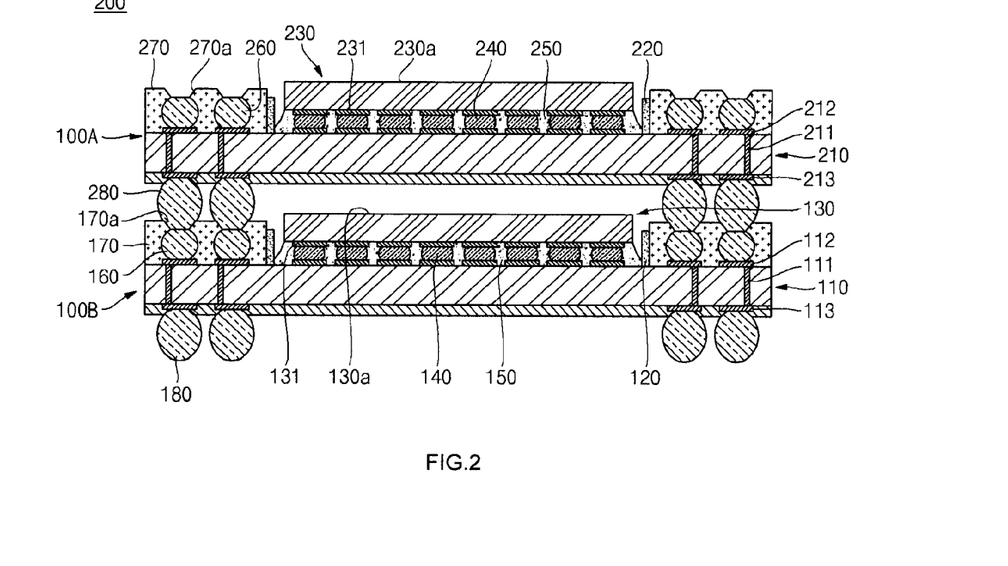
FIG. 2 is a sectional view of a semiconductor device according to another embodiment.

Hereinafter, the structure of a semiconductor device 200 according to another embodiment will be described. FIG. 2 is a sectional view of the semiconductor device 200 according to another embodiment.

Referring to FIG. 2, the semiconductor device 200 includes substrates 110 and 210, encapsulant dams 120 and 220, semiconductor dies 130 and 230, conductive bumps 140 and 240, underfills 150 and 250, pre-solder balls 160 and 260, encapsulants 170 and 270, and solder balls 180 and 280.

The semiconductor device 200 is constructed by stacking two of the semiconductor devices 100 of the previous embodiment that are labeled as an upper semiconductor device 100A and a lower semiconductor device 100B. In other words, the structures from the substrate 210 through the solder balls 280 of the upper semiconductor device 100A are equivalent to the substrate 110 through the solder balls 180 of the lower semiconductor device 100B, respectively, and are relabeled for ease of discussion.

The solder balls 280 of the upper semiconductor device 100A are connected with the pre-solder balls 160 of the lower semiconductor device 100B. The solder balls 280 are connected with the pre-solder balls 160 through the via apertures 170a of the encapsulant 170. Accordingly, the solder balls 280 are input with electrical signals of the pre-solder balls 160 and transmit the electrical signals to the semiconductor die 230 through the lands 213, the conductive vias 211, the conductive patterns 212, and the conductive bumps 240 of the upper semiconductor device 100A.

Figure 3:
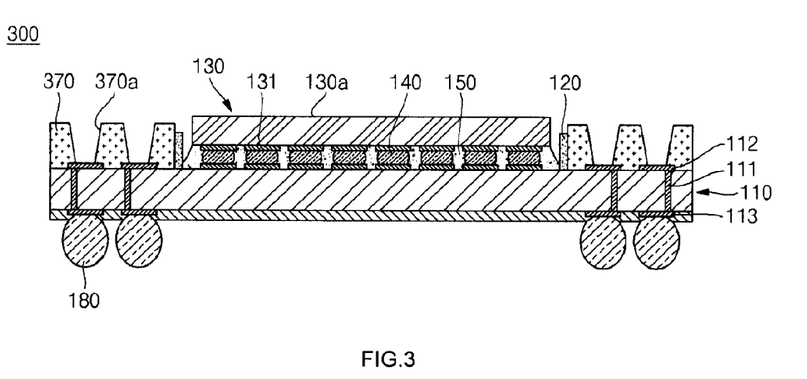
FIG. 3 is a sectional view of a semiconductor device according to a further embodiment.

Hereinafter, the structure of a semiconductor device 300 according to a further embodiment will be described. FIG. 3 is a sectional view of the semiconductor device 300 according to the further embodiment.

Referring to FIG. 3, the semiconductor device 300 includes the substrate 110, the encapsulant dam 120, the semiconductor die 130, the conductive bumps 140, the underfill 150, an encapsulant 370, and the solder balls 180.

The encapsulant 370 is disposed on the upper part of the substrate 110. More specifically, the encapsulant 370 is disposed on the outer periphery of the substrate 110 and kept out of contact with the semiconductor die 130 by the encapsulant dam 120. The encapsulant 370 includes via apertures 370a corresponding to the conductive patterns 112, sometimes called stacking terminals, disposed on the periphery of the substrate 110. The via apertures 370a of the encapsulant 370 may be formed by performing a laser drilling process from an upper part of the encapsulant 370 such that the via apertures 370a extend entirely through the encapsulant 370 to the corresponding conductive patterns 112. The encapsulant 370 exposes the conductive patterns 112 through the via apertures 370a. That is, the encapsulant 370 enables solder balls of another semiconductor device stacked thereon to be easily connected with the conductive patterns 112. In addition, since the conductive patterns 112 are exposed, it is unnecessary to separately provide pre-solder balls. Accordingly, the semiconductor device 300 is capable of reducing fabrication cost and process.

Figure 4:
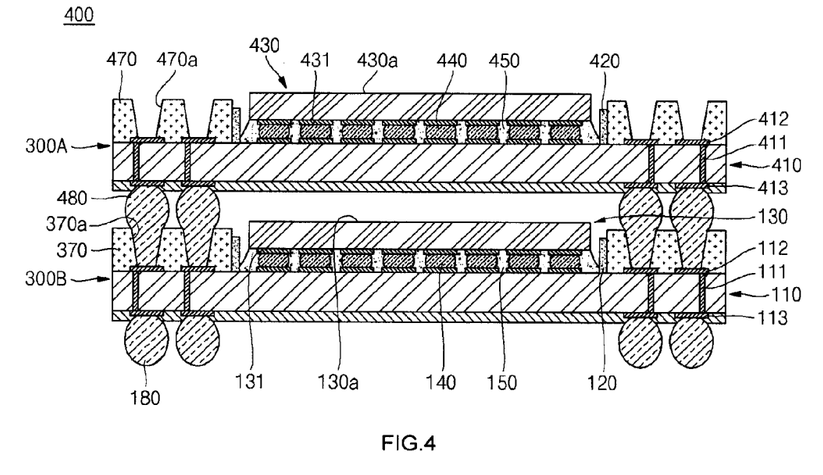
FIG. 4 is a sectional view of a semiconductor device according to still another embodiment.

Hereinafter, the structure of a semiconductor device 400 according to still another embodiment will be described. FIG. 4 is a sectional view of the semiconductor device 400 according to still another embodiment.

Referring to FIG. 4, the semiconductor device 400 includes substrates 110 and 410, encapsulant dams 120 and 420, semiconductor dies 130 and 430, conductive bumps 140 and 440, underfills 150 and 450, encapsulants 370 and 470, and solder balls 180 and 480.

The semiconductor device 400 is constructed by stacking two of the semiconductor devices 300 of the previous embodiment that are labeled as an upper semiconductor device 300A and a lower semiconductor device 300B. In other words, the structures from the substrate 410 through the solder balls 480 of the upper semiconductor device 300A are equivalent to the substrate 110 through the solder balls 180 of the semiconductor device 300B, respectively, and are relabeled for ease of discussion.

The solder balls 480 are connected with the lands 413 of the upper semiconductor device 300A and the conductive patterns 112 of the substrate 110 of the lower semiconductor device 300B. More specifically, the solder balls 480 extend from the lands 413 to be connected with the conductive patterns 112 through the via apertures 370a. Therefore, the solder balls 480 are input with electrical signals from the conductive patterns 112 and transmit the electrical signals to the semiconductor die 430 through the lands 413, the conductive vias 411, the conductive patterns 412, and the conductive bumps 440 disposed thereon.

Hereinafter, a method of fabricating the semiconductor device 100 according to one embodiment will be described.

Figure 5:
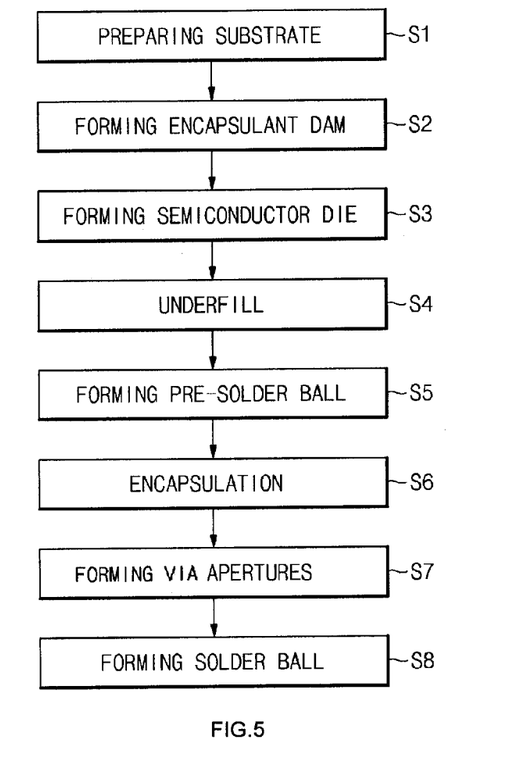
FIG. 5 is a flow chart illustrating a method of fabricating the semiconductor device according to one embodiment.

FIG. 5 is a flow chart illustrating a method of fabricating the semiconductor device 100 according to one embodiment. FIGS. 6A through 6H are views illustrating the fabricating method of the semiconductor device 100 according to one embodiment.

Referring to FIG. 5, the fabricating method of the semiconductor device 100 includes a preparing substrate operation S1, a forming encapsulant dam operation S2, a forming semiconductor die operation S3, an underfill operation S4, a forming pre-solder ball operation S5, an encapsulation operation S6, a forming via apertures operation S7, and a forming solder ball operation S8. Hereinafter, the respective operations will now be described with reference to FIGS. 6A through 6H.

Figure 6A:
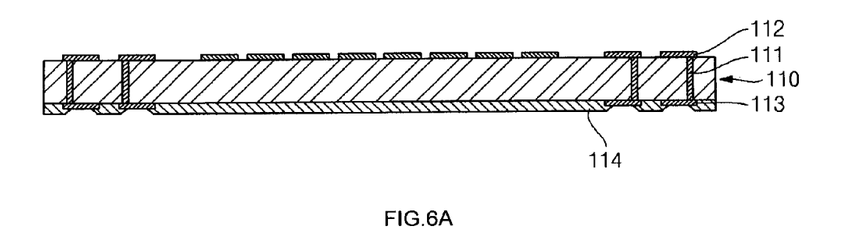
FIGS. 6A, 6B, 6C, 6D, 6E, 6F, 6G, 6H are sectional views illustrating the fabricating method of the semiconductor device according to one embodiment.

As shown in FIGS. 5 and 6A, the substrate 110 including the conductive vias 111, the conductive patterns 112, and the lands 113 is prepared in preparing substrate operation S1. The lower surface of the substrate 110 is covered with the solder mask 114 except for the regions to expose the lands 113. Although not shown, the upper surface of the substrate 110 may also be covered with a solder mask except for regions for forming the conductive patterns 112. The conductive patterns 112 and the lands 113 are connected with each other through the conductive vias 111.

Figure 6B:
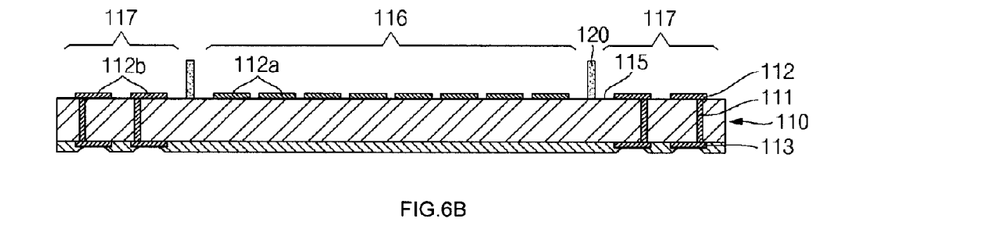

As shown in FIGS. 5 and 6B, the encapsulant dam 120 is formed on the upper part 115, sometimes called the upper surface 115, of the substrate 110 (which may or may not include a solder mask) in the forming encapsulant dam operation S2. The encapsulant dam 120 may be fabricated using solder resist. The encapsulant dam 120 protrudes by a predetermined height from the upper surface 115 of the substrate 110, thereby defining the closed inner region 116 of the upper surface 115 of the substrate 110. Some of the conductive patterns 112 are disposed within the inner region 116 defined by the encapsulant dam 120 while the others are disposed on the outer periphery 117, sometimes called the outer region 117, of the upper surface 115 of the substrate 110 defined by the encapsulant dam 120.

Generally, encapsulant dam 120 defines the inner region 116 of substrate 110 inward of encapsulant dam 120 and the outer region 117 of substrate 110 outward of encapsulant dam 120. The outer region 117 is also sometimes called the outer periphery of the encapsulant dam 120.

The portions of conductive patterns 112 within the inner region 116 are sometimes called flip chip terminals 112a. The portions of conductive patterns 112 within the outer region 117 are sometimes called stacking terminals 112b.

Figure 6C:
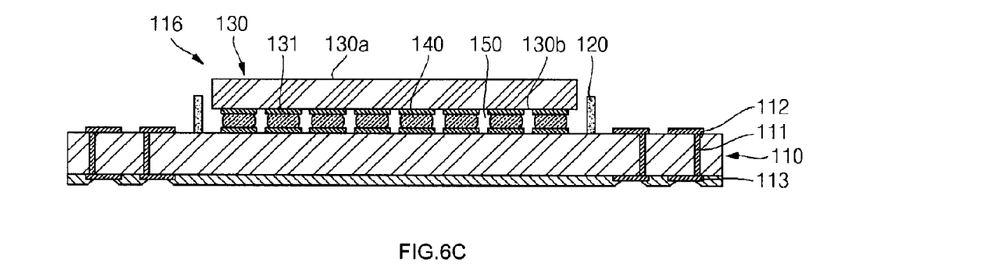

As shown in FIGS. 5 and 6C, the semiconductor die 130 is formed at the upper part of the substrate 110 in the forming semiconductor die operation S3. A plurality of the bond pads 131 are formed on the active surface 130b of the semiconductor die 130. The semiconductor die 130 in the form of a flip chip is attached to the upper part of the substrate 110 such that the bond pads 131 are directed to the conductive patterns 112. In addition, the semiconductor die 130 is disposed within the inner region 116 defined by the encapsulant dam 120. The conductive bumps 140 are formed on the bond pads 131 and, in this state, the semiconductor die 130 is connected to the upper part of the conductive patterns 112. According to this, the bond pads 131 are electrically connected with the conductive patterns 112 through the conductive bumps 140.

Figure 6D:
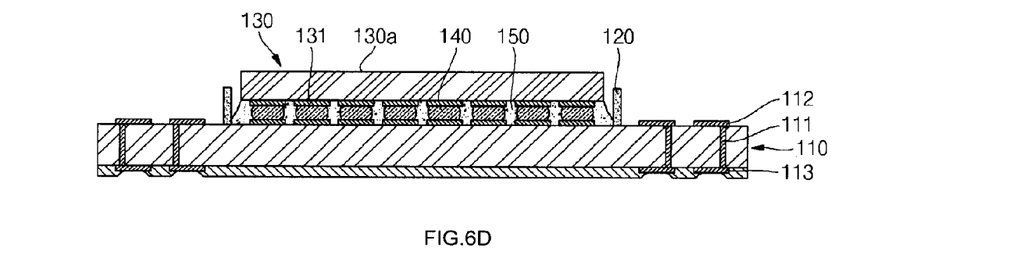

As shown in FIGS. 5 and 6D, the underfill 150 is formed between the respective neighboring conductive bumps 140 and in a peripheral region of the conductive bumps 140, in the underfill operation S4. The underfill 150 encloses and fixes the conductive bumps 140. The underfill 150 fills gaps among the conductive bumps 140, the semiconductor die 130, and the substrate 110.

Figure 6E:
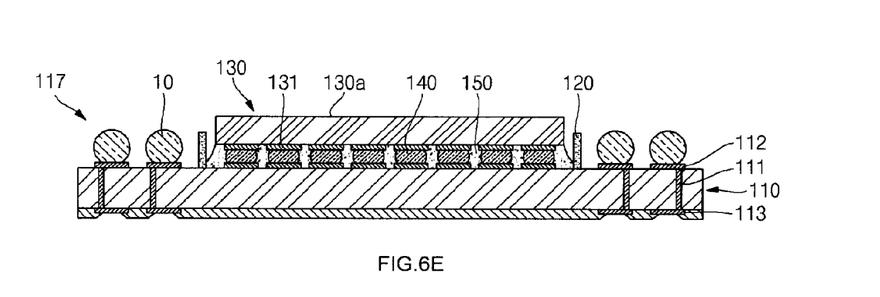

As shown in FIGS. 5 and 6E, pre-solder balls 10 are formed on the upper part of the substrate 110 in the forming pre-solder ball operation S5. The pre-solder balls 10 are formed on the upper part of the conductive patterns 112 of the substrate 110 located within the outer region 117. Also, the pre-solder balls 10 have a substantially spherical shape.

Figure 6F:
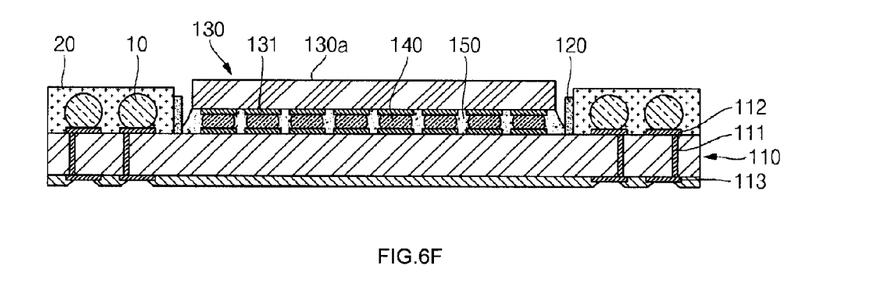

As shown in FIGS. 5 and 6F, an encapsulant 20 is formed on the outer region 117 of the substrate 110 in the encapsulation operation S6. The encapsulant 20 being injected to the upper part of the substrate 110 is prevented by the encapsulant dam 120 from reaching the lower part of the semiconductor die 130. As a result, the encapsulant 20 is formed along the outer periphery of the encapsulant dam 120 and disposed at outer region 117 of the substrate 110.

Figure 6G:
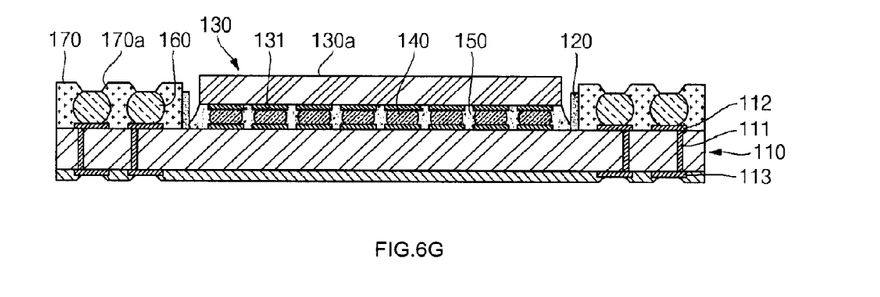

As shown in FIGS. 5 and 6G, the via apertures 170a are formed at the upper part of the encapsulant 20 in the forming via apertures operation S7. The via apertures 170a are formed in the encapsulant 20 by a laser drilling process, resulting in the final structure of the encapsulant 170. The forming via apertures operation S7 is performed until the upper parts of the pre-solder balls 10 are exposed. As a result, the upper parts of the pre-solder balls 10 are partially planarized, resulting in the final form of the pre-solder balls 160.

Figure 6H:
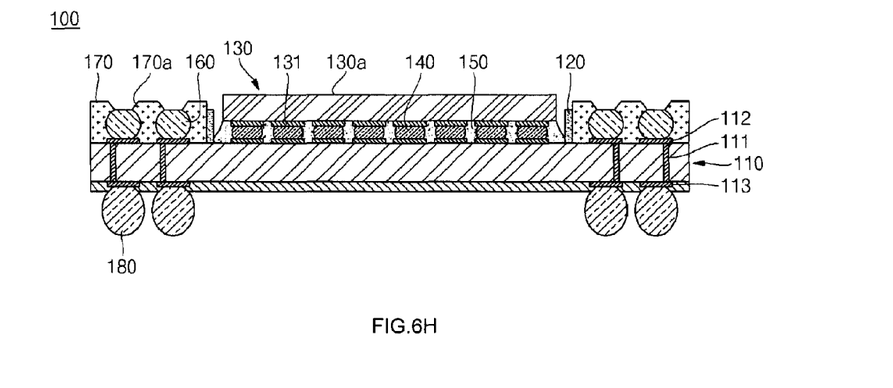

As shown in FIGS. 5 and 6H, the solder balls 180 are formed at the lower part of the substrate 110 in the forming solder ball operation S8. The solder balls 180 are connected to the lands 113 of the substrate 110. Next, the solder balls 180 may be connected with an external printed circuit board (PCB), thereby forming the electrical connection path of the semiconductor device 100 according to the embodiment.

Although specific embodiments were described herein, the scope of the invention is not limited to those specific embodiments. Numerous variations, whether explicitly given in the specification or not, such as differences in structure, dimension, and use of material are possible. The scope of the invention is at least as broad as given by the following claims.

What is claimed is:

1. A semiconductor device comprising:
   a substrate comprising an upper surface;
   an encapsulant dam coupled to the upper surface, the encapsulant dam defining an inner region and an outer region of the substrate;
   flip chip terminals coupled to the upper surface of the substrate within the inner region;
   stacking terminals coupled to the upper surface of the substrate within the outer region;
   a semiconductor die within the inner region and coupled to the flip chip terminals; and
   an encapsulant within the outer region.

2. The semiconductor device of claim 1 wherein the encapsulant is disposed around an outer periphery of the encapsulant dam.

3. The semiconductor device of claim 1 further comprising pre-solder balls coupled to the stacking terminals.

4. The semiconductor device of claim 3 wherein the encapsulant encloses the pre-solder balls.

5. The semiconductor device of claim 4 wherein the encapsulant comprises via apertures exposing the pre-solder balls.

6. The semiconductor device of claim 3 wherein the pre-solder balls are planarized.

7. The semiconductor device of claim 1 wherein the encapsulant comprises via apertures formed therein to expose the stacking terminals.

8. The semiconductor device of claim 1, wherein the encapsulant dam comprises solder resist.

9. The semiconductor device of claim 1, wherein the inner region has a larger area than the semiconductor die.

10. The semiconductor device of claim 1 further comprising conductive bumps coupling bond pads of the semiconductor die to the flip chip terminals.

11. The semiconductor device of claim 10 further comprising an underfill enclosing the conductive bumps.

12. The semiconductor device of claim 11, wherein the underfill is disposed within the inner region.

13. The semiconductor device of claim 1, wherein the semiconductor die comprises an inactive surface exposed to the outside.

14. A semiconductor device comprising:
a first semiconductor device comprising:
   a first substrate comprising a lower surface; and
   lands coupled to the lower surface;
a second semiconductor device comprising:
   a second substrate comprising an upper surface;
   an encapsulant dam coupled to the upper surface of the second substrate, the encapsulant dam defining an inner region and an outer region of the second substrate;
   an encapsulant within the outer region;
   stacking terminals coupled to the upper surface of the second substrate within the outer region, wherein the lands of the first semiconductor device are coupled to the stacking terminals through via apertures of the encapsulant.

15. The semiconductor device of claim 14 wherein the via apertures extend entirely through the encapsulant to the stacking terminals, the semiconductor device further comprising:
solder balls extending from the lands to the stacking terminals through the via apertures.

16. The semiconductor device of claim 14 wherein the second semiconductor device further comprises:
pre-solder balls coupled to the stacking terminals,
wherein the first semiconductor device further comprises:
solder balls coupled to the pre-solder balls through the via apertures.

17. A semiconductor device, comprising:
a substrate comprising an upper surface;
an encapsulant dam coupled to the upper surface of the substrate;
a semiconductor die coupled to the upper surface of the substrate within an inner region defined by the encapsulant dam;
an encapsulant coupled to the upper surface of the substrate within an outer region defined by the encapsulant dam; and
stacking terminals coupled to the upper surface of the substrate within the outer region.

18. The semiconductor device of claim 17 further comprising:
pre-solder balls coupled to the stacking terminals; and
via apertures within the encapsulant to expose the pre-solder balls.

19. The semiconductor device of claim 17 further comprising:
via apertures extending entirely though the encapsulant to expose the stacking terminals.

\* \* \* \* \*